United States Patent [19]

Hain

[11] Patent Number: 5,480,051
[45] Date of Patent: Jan. 2, 1996

[54] METHOD FOR THE ANISOTROPIC ETCHING OF AN ALUMINIFEROUS LAYER

[75] Inventor: Manfred Hain, Zorneding, Germany

[73] Assignee: Siemens Aktiengesellschaft, Munich, Germany

[21] Appl. No.: 235,987

[22] Filed: May 2, 1994

[30] Foreign Application Priority Data

May 27, 1993 [DE] Germany .................. 43 17 722.0

[51] Int. Cl.$^6$ ...................................... C23F 1/00
[52] U.S. Cl. ...................... 216/67; 216/77; 252/79.1
[58] Field of Search ................... 156/643, 651, 156/656, 659.1, 665; 252/79.1; 204/192.32; 216/41, 58, 67, 77

[56] References Cited

U.S. PATENT DOCUMENTS

| 4,855,016 | 8/1989 | Jucha et al. | 156/643 |
| 4,919,748 | 4/1990 | Bredbenner et al. | 156/643 |
| 4,925,813 | 5/1990 | Autier et al. | 156/643 X |
| 5,068,007 | 11/1991 | Rogers et al. | 156/665 X |
| 5,277,750 | 1/1994 | Frank | 156/643 |

OTHER PUBLICATIONS

Kimizuka et al, *Pattern profile control in magnetron reactive ion etching of poly–Si*, J. Vac Sci. Technol. B, vol. 10, No. 5, pp. 2192–2196 (1992).

Lutze et al, *Anisotropic Reactive Ion Etching of Aluminum Using $Cl_2$, $BCl_3$ and $CH_4$ Gases*, J. Electrochem. Soc., vol. 137, No. 1, pp. 249–252 (1990).

Riley et al, *Plasma Etching of Aluminum for ULSI Circuits*, Solid State Technology, pp. 47–55 (Feb. 1993).

*Primary Examiner*—William Powell
*Attorney, Agent, or Firm*—Hill, Steadman & Simpson

[57] ABSTRACT

Aluminiferous structures having a sidewall angle greater than or equal to zero are produced by the addition of a volatile hydrocarbon to the etching gas mixture in a plasma etching process. The volatile hydrocarbon promotes the sidewall passivation, so that extremely fine structures can be anisotropically etched. Given aluminum-copper alloys, moreover, the formation of etching residues that contain copper and are not easily volatilized is also prevented.

17 Claims, No Drawings

METHOD FOR THE ANISOTROPIC ETCHING OF AN ALUMINIFEROUS LAYER

BACKGROUND OF THE INVENTION

The present invention generally relates to methods for plasma etching of metallization layers. More specifically, the present invention provides a method for anisotropic etching of an aluminiferous layer in a vacuum chamber.

In microelectronics, layers having aluminum alloys such as aluminum-silicon, aluminum-copper, or aluminum-silicon-copper are utilized in the wiring levels of integrated circuits as critical interconnect material. These layers are structured to form interconnects with a lacquer mask that is correspondingly exposed. The structuring is usually implemented in a vacuum chamber with a gas mixture containing chlorine or chlorine compounds at low pressure with high-frequency enhancement (plasma etching process). The aluminum-chlorine reaction is spontaneous and occurs without ion support. A sidewall passivation that protects the lateral aluminum sidewall against an isotropic etching attack is therefore necessary for aluminum structuring that is free of underetching, i.e. anisotropic. This sidewall passivation is constructed of lacquer constituents or the reaction products thereof that are produced by ion-assisted erosion of the lacquer mask. Such etching processes are described in, for example, the article by P. Ridley et al. in *Solid State Technology*, Feb. 1993, pages 47–55.

With increasing miniaturization of the structures to be manufactured, the following problems, among others, arise, given this method wherein the sidewall passivation is based on the erosion of the lacquer mask. For instance, the prescribed topography of the background (only a thin lacquer layer is present at raised locations) limits the maximum lacquer thickness that can be eroded. Moreover, the lacquer thickness is limited for exposure-orientated reasons (limited depth of field and resolution). In addition, more aluminum sidewalls per unit of area must be protected given finer and finer structures, i.e. a larger area of sidewall passivation must be produced. Still further, area relationships of lacquer to aluminum that differ greatly generally occur on a chip. Underetchings often exist due to the lack of lacquer, given insulated interconnects and correspondingly little lacquer available. Moreover, the risk of copper residues that cannot be removed is extremely high, given copper-containing aluminum alloys and a lacquer part that is locally or globally too small. Additionally, given circuits having a plurality of metallization levels for achieving higher integration densities, positively beveled aluminum sidewalls (i.e., the upper edge of the structure is not as wide as the underedge) are desirable for better deposition of the intermetallic dielectric.

The industry has adopted a number of measures to resolve the above-identified problems. For instance, increasing the lacquer erosion can improve the sidewall passivation. This improvement, however, is accompanied by a risk of unacceptable, incipient etching of raised aluminum tracks. Adding halogenated hydrocarbons can promote the formation of sidewall passivation, given coarser structures. However, this formation is no longer adequate given the finer structures. Given employment of mixtures of etching gas that lead to thinner sidewall passivation films with less of a lacquer erosion, the risk exists that gaps will arise locally in the passivation film, particularly at insulated interconnects, so that underetching occurs. Fundamentally, diminishing the height differences of the background, i.e. by global planarization, can also alleviate the problem of lacquer thickness. To this end, however, extensive modifications in the chip structure and/or in the manufacturing method are necessary. Increasing the ion bombardment can remove etching residues that contain copper; this, however, simultaneously results in an increased lacquer erosion. Finally, positively beveled aluminum sidewalls can be produced on the basis of a retreat of lacquer, accepting what is referred to as loss of dimension. Such a method, obviously, can no longer be utilized given fine structures.

Therefore, a need exists for an improved method of etching aluminiferous layers completely anisotropically.

SUMMARY OF THE INVENTION

The present invention provides a method for anisotropic etching of an aluminiferous layer in a vacuum chamber. Pursuant to the present invention, extremely fine grids and insulated interconnects are capable of being manufactured without underetching.

The present invention focuses on the utilization of a volatile hydrocarbon as part of an etching gas mixture utilized preferably in a plasma etching process. Pursuant to the present invention, a volatile hydrocarbon is added to an etching gas. Thereafter, an aluminiferous layer partially covered with a lacquer mask is exposed to the etching gas to form an aluminiferous structure having a positive sidewall angle.

In a preferred embodiment, the method includes the further step of generating a high-frequency field to produce a plasma environment.

In an embodiment, the volatile hydrocarbon is methane and the etching gas is a chlorine-containing gas mixture. Preferably, the methane has a flow rate of approximately of 1% to 50% that of the chlorine-containing gas mixture.

In an embodiment, the method includes the further step of removing etching residues remaining on the aluminiferous layer by overexposing the aluminiferous layer to the etching gas containing the volatile hydrocarbon.

In still another embodiment, the method of the present invention includes the further step of forming a sidewall passivation at the sidewalls of the aluminiferous structure.

The present invention also provides a method of fabricating an integrated semiconductor circuit. In such a method, an aluminiferous layer is first deposited upon a substrate. Then, the aluminiferous layer is etched with a gas mixture including a volatile hydrocarbon to produce an aluminiferous structure having a positive sidewall angle.

In an embodiment, the volatile hydrocarbon is methane.

In an embodiment, the aluminiferous layer is a multiple layer having an aluminum rich sub-layer. Suitable aluminum rich sublayers are aluminum and aluminum alloys.

An advantage of the present invention is that it provides an improved method of etching aluminiferous layers completely anisotropically.

Another advantage of the present invention is that it utilizes volatile hydrocarbons, such as methane, that are simple and harmless gases.

Still further, an advantage of the present invention is that it allows for the manufacturing of extremely fine grids and insulated interconnects without underetching. For example, interconnects having a 0.5 μm grid can be unproblematically manufactured pursuant to the present invention.

Yet another advantage of the present invention is that it utilizes a volatile hydrocarbon that assists in the formation of a sidewall passivation in that the polymer-forming constituents are made available. Due to such formation, the lacquer thickness can be reduced and/or individual interconnects with great spacing or extremely fine structures can be anisotropically etched.

In addition, an advantage of the present invention is that a sidewall angle of the etched structures can be exactly set on the basis of the variable addition of the volatile hydrocarbon without dimensional losses occurring.

Still further, an advantage of the present invention is that a uniform sidewall passivation can be achieved everywhere with circuits having a highly varying ratio of areas between lacquer and aluminum.

Moreover, an advantage of the present invention is that it eliminates the problems associated with etching residues that arise when utilizing aluminum-copper alloys, since these etching residues are removed by the use of a volatile hydrocarbon.

Additional features and advantages of the present invention are described in, and will be apparent from, the detailed description of the preferred embodiments.

DETAILED DESCRIPTION OF THE PREFERRED EMBODIMENT

Pursuant to the present invention, a volatile hydrocarbon compound ($C_nH_m$), preferably methane ($CH_4$), is added to the etching gas. Utilizing a volatile hydrocarbon as part of the etching gas mixture promotes the anisotropic etching of aluminiferous layers. The volatile hydrocarbon promotes the formation of a sidewall passivation at the sidewalls of a formed aluminiferous structure. In addition, overexposing the aluminiferous layer to the etching gas containing the volatile hydrocarbon removes etching residues that may remain on the aluminiferous layer. With the use of an etching gas mixture containing such a volatile hydrocarbon, extremely fine grids and insulated interconnects are capable of being manufactured without underetching.

By way of example, and not limitation, an exemplary embodiment of the present invention will now be given.

A sandwich structure aluminum-silicon-copper (AlSiCu)/titanium-nitride (TiN)/tungsten (TN) is to be etched as an aluminiferous layer. A hexode plasma etching system and a multi-stage etching process are utilized. For example, the process parameters can amount to:

| STEP | 1 | 2 |
| --- | --- | --- |
| $N_2$ [sccm] | 100 | 100 |
| $Cl_2$ [sccm] | 60 | 36 |
| $CH_4$ [sccm] | 6 | 4 |
| Bias [V] | 280 | 280 |
| Pressure [mT] | 40 | 40 |
| Temp [°C.] | 50 | 50 |

Step 1: AlSiCu, TiN, Ti and photoresist are etched by $Cl_2$. Titanium nitride, titanium and photoresist only etch by ion assistance in a high-frequency plasma. The etching rates, particularly that of the lacquer, increase with higher bias voltage. Aluminum is spontaneously etched by chlorine. Nitrogen effects an increase in the aluminum etching rates and leads to smoother aluminum sidewalls.

With enhancement of the etched photoresist, methane as a volatile hydrocarbon forms a sidewall passivation that protects the aluminum sidewall against etching. The controllable growth in thickness of this passivation film produces the positive sidewall angle of the interconnect. Varying the $CH_4/Cl_2$ ratio can thereby set the aluminum sidewall angle without dimensional losses occurring. An increase of the $CH_4$ or, respectively, a reduction of the $Cl_2$ flow leads to a more pronounced beveling. The etching rate of the aluminum alloy essentially varies inversely relative to the methane flow. Dependent on the boundary conditions, in an embodiment, the methane flow amounts to approximately 1% to 50% of the chlorine flow. Heating the etching chamber results in less etched material being deposited at the chamber walls.

Step 2: Pursuant to the present invention, etching residues can be removed with the use of a volatile hydrocarbon. Effectively, removing the excess etching residues remaining on the aluminiferous layer requires an over-etching of the aluminiferous layer.

In this over-etching step, AlSiCu residues, TiN/Ti residues or, respectively, Si/Cu precipitates that deposit at the aluminum grain boundaries during sputtering and etching residues that are not easily volatile are removed. Because only minimum areas are generally to be etched, the chlorine and methane flows are reduced. As in step 1, the methane/chlorine ratio can be matched to the boundary conditions.

Subsequently, the lacquer as well as the sidewall passivation are removed in a suitable manner.

Understandably, various changes and modifications to the presently preferred embodiments described herein will be apparent to those skilled in the art. Such changes and modifications can be made without departing from the spirit and scope of the present invention and without diminishing its attendant advantages. Therefore, the appended claims are intended to cover such changes and modifications.

I claim:

1. A method for anisotropic etching an aluminiferous layer in a vacuum chamber comprising the steps of:

generating a high-frequency field to produce a plasma environment;

adding a volatile; non-halogen-containing hydrocarbon to a chlorine-containing etching gas; and exposing the aluminiferous layer partially covered with a lacquer mask to the chlorine-containing etching gas, in the plasma environment, to form an aluminiferous structure having a sidewall angle greater than or equal to zero, the sidewall angle being set by the ratio of the volatile hydrocarbon to the chlorine-containing etching gas.

2. The method of claim 1 comprising the additional step of providing an aluminiferous layer having a sub-layer selected from the group consisting of aluminum and aluminum alloy.

3. The method of claim 1 wherein the step of adding a volatile hydrocarbon to an etching gas is further defined by adding methane to a chlorine-containing etching gas mixture, the methane having a flow rate of approximately 1% to 50% that of the chlorine in the gas mixture.

4. The method of claim 1 including the further step of removing etching residues remaining on the aluminiferous layer by overexposing the aluminiferous layer to the etching gas containing the volatile hydrocarbon.

5. The method of claim 4 further defined by removing copper-containing etching residues.

6. The method of claim 1 including the further step of forming a sidewall passivation at the sidewalls of the aluminiferous structure, the lacquer mask having a thickness less than a thickness necessary for the formation of the sidewall passivation.

7. A method for anisotropic etching of an aluminiferous layer having a lacquer mask, occurring in a generated high-frequency field, wherein the improvement comprises etching with a gas mixture containing a volatile, non-halogen containing hydrocarbon to produce an aluminiferous structure having a sidewall angle greater than or equal to zero, the sidewall angle being set by the ratio of the volatile hydrocarbon to the chlorine-containing etching gas.

8. The method of claim 7 further comprising the step of forming a sidewall passivation at the sidewalls of the aluminiferous structure.

9. The method of claim 7 including the further step of removing etching residues remaining on the aluminiferous layer by overexposing the aluminiferous layer to the etching gas containing the volatile hydrocarbon.

10. The method of claim 7 comprising the additional step of providing a gas mixture including methane and chlorine, the methane having a flow rate of approximately 1% to 50% that of the chlorine.

11. A method for fabricating an integrated semiconductor circuit comprising the steps of:
depositing an aluminiferous layer on a substrate; and
etching the aluminiferous layer with an etching gas mixture including a volatile, non-halogen containing hydrocarbon to produce an interconnect having a sidewall angle greater than or equal to zero, the sidewall angle being set by the ratio of the volatile hydrocarbon to the etching gas mixture.

12. The method of claim 11 comprising the additional step of providing an aluminiferous layer having a sub-layer selected from the group consisting of aluminum and aluminum alloy.

13. The method of claim 11 comprising the additional step of providing methane as the volatile hydrocarbon.

14. The method of claim 13 comprising the additional step of providing a gas mixture containing chlorine and the methane, the methane having a flow rate of approximately 1% to 50% that of the chlorine.

15. The method of claim 11 further defined by conducting the etching in a plasma environment.

16. The method of claim 11 comprising the additional step of providing a multiple layer, as the aluminiferous layer, having an aluminum rich sub-layer.

17. The method of claim 11 comprising the additional step of providing a multiple layer, as the aluminiferous layer, having an aluminum-copper-silicon alloy layer, a titanium-nitride layer, and a tungsten layer.

* * * * *